United States Patent
Kumar et al.

(10) Patent No.: US 9,590,602 B2
(45) Date of Patent: Mar. 7, 2017

(54) SYSTEM AND METHOD FOR A PULSE GENERATOR

(71) Applicant: STMicroelectronics International N.V., Amsterdam (NL)

(72) Inventors: Shishir Kumar, Greater Noida (IN); Tanmoy Roy, Greater Noida (IN)

(73) Assignee: STMicroelectronics International N.V., Amsterdam (NL)

( * ) Notice: Subject to any disclaimer, the term of this patent is extended or adjusted under 35 U.S.C. 154(b) by 4 days.

(21) Appl. No.: 14/304,357

(22) Filed: Jun. 13, 2014

(65) Prior Publication Data

US 2015/0365080 A1 Dec. 17, 2015

(51) Int. Cl.
    *H03K 5/01* (2006.01)
    *G11C 8/18* (2006.01)
    *G11C 7/22* (2006.01)

(52) U.S. Cl.
    CPC ............... *H03K 5/01* (2013.01); *G11C 7/222* (2013.01); *G11C 8/18* (2013.01)

(58) Field of Classification Search
    CPC ........................................................ G11C 8/18
    USPC ...................................................... 365/233.1
    See application file for complete search history.

(56) References Cited

U.S. PATENT DOCUMENTS

| | | | |
|---|---|---|---|
| 5,557,225 A | 9/1996 | Denham et al. | |
| 5,612,632 A | 3/1997 | Mahant-Shetti et al. | |
| 5,796,673 A * | 8/1998 | Foss | G11C 7/1051 327/284 |
| 6,172,537 B1 * | 1/2001 | Kanou | G06F 1/10 327/149 |
| 6,194,932 B1 * | 2/2001 | Takemae | G06F 1/10 327/141 |
| 6,222,406 B1 * | 4/2001 | Noda | G11C 7/1078 327/269 |
| 6,275,083 B1 | 8/2001 | Martinez et al. | |
| 6,329,861 B1 * | 12/2001 | Francis | H03K 5/1565 327/291 |
| 6,515,528 B1 | 2/2003 | Tohsche | |
| 6,937,079 B1 | 8/2005 | Zhao et al. | |
| 6,947,349 B1 * | 9/2005 | Abdollahi-Alibeik | G11C 11/419 365/194 |
| 7,432,752 B1 * | 10/2008 | Lee | H03K 5/06 327/172 |
| 7,557,632 B2 | 7/2009 | Kim | |
| 7,742,551 B2 * | 6/2010 | Pyeon | H03K 21/38 375/354 |
| 2001/0011913 A1 * | 8/2001 | Sher | 327/165 |
| 2002/0021152 A1 * | 2/2002 | Goto | G06F 1/04 327/156 |

(Continued)

*Primary Examiner* — Anthan Tran
*Assistant Examiner* — Mushfique Siddique
(74) *Attorney, Agent, or Firm* — Slater Matsil, LLP (57) ABSTRACT

According to an embodiment, a method of generating a clock pulse includes receiving a leading edge at a clock input at a time when an enable signal is active, generating an edge at a clock output based on the received leading edge at the clock input, latching a logic value corresponding to the edge at the clock output, preventing changes at the clock input from affecting the latched logic value after the logic value is latched, resetting the latched logic value after a first delay time, and maintaining the reset logic value until a second edge is received at the clock input. The second edge at the clock input matches the leading edge at the clock input.

33 Claims, 10 Drawing Sheets

(56) References Cited

U.S. PATENT DOCUMENTS

| | | | | |
|---|---|---|---|---|
| 2002/0141280 A1* | 10/2002 | Hamamoto | ........... | G11C 7/1051 |
| | | | | 365/233.1 |
| 2007/0229135 A1* | 10/2007 | Branch | .................. | H03K 5/135 |
| | | | | 327/291 |
| 2008/0069284 A1* | 3/2008 | Kuhns | ..................... | G06F 1/025 |
| | | | | 375/376 |
| 2009/0167355 A1* | 7/2009 | Bosshart | .......... | H03K 19/01855 |
| | | | | 326/62 |
| 2010/0171528 A1* | 7/2010 | Guillot | ...................... | G06F 1/24 |
| | | | | 327/20 |
| 2012/0230144 A1* | 9/2012 | Nagata | ................. | H03K 21/406 |
| | | | | 365/233.11 |
| 2013/0142003 A1 | 6/2013 | Kohli et al. | | |

\* cited by examiner

*Figure 1*

PRIOR ART

SYSTEM AND METHOD FOR A PULSE GENERATOR

TECHNICAL FIELD

The present invention relates generally to electronic circuits, and, in particular embodiments, to a system and method for a pulse generator.

BACKGROUND

Generally, digital logic circuits may be divided into two broad categories: synchronous logic circuits and asynchronous logic circuits. Synchronous logic circuits modify and store values synchronously with some type of clock signal. Asynchronous logic circuits modify values continuously based on inputs independent of a clock signal. Synchronous logic circuits are usually used any time logic values need to be remembered by storing the logic state. When storing a logic state in synchronous logic circuits, a register or flip-flop is used to capture the logic values at an input periodically based on a clock signal and maintain the logic value on an output. Asynchronous logic circuits are also capable of storing logic values in a component called a latch. Latches are controlled to maintain a value supplied until a different value is supplied or "latched."

In terms of synchronous logic circuits, the clock signal may have significant impact on system performance and operation. For example, modern computer processors and memories are highly complex synchronous digital logic circuits. Logic values are written to and read from memories periodically based on a clock signal. Additionally, digital logic calculations are performed and supplied at outputs of a processing unit periodically based on a clock signal or a multiple of the clock signal (i.e., multiple cycles). Registers and other memory elements are used to maintain and distribute logic values throughout the system and the clock signal or signals are used to synchronize setting and resetting of logic values so that systems can predictably perform numerous calculations per second.

In many systems, such as computing systems with memories, multiple types of clock signals may be used for different components. For example, a unifying system clock or signal may be used to synchronize the period of each component in the system, but the components may operate based on different types of signals than that provided by the system clock. In such situations, a clock pulse generator may be used to generate a new clock pulse based on an input system signal, for example.

SUMMARY OF THE INVENTION

According to an embodiment, a method of generating a clock pulse includes receiving a leading edge at a clock input at a time when an enable signal is active, generating an edge at a clock output based on the received leading edge at the clock input, latching a logic value corresponding to the edge at the clock output, preventing changes at the clock input from affecting the latched logic value after the logic value is latched, resetting the latched logic value after a first delay time, and maintaining the reset logic value until a second edge is received at the clock input. The second edge at the clock input matches the leading edge at the clock input.

According to another embodiment, a method of generating a clock pulse includes receiving a leading edge at a clock input at a time when an enable signal is active, generating an edge at a clock output based on the received leading edge at the clock input, latching a logic value corresponding to the edge at the clock output, isolating the latched logic value from changes at the enable signal and at the clock input after the logic value is latched, and resetting the latched logic value after a first delay time. Isolating the latched logic value is based on the clock output.

According to a further embodiment, a clock pulse generator circuit includes an isolation buffer including an input coupled to a signal input node, a first latch including an input coupled to an output of the isolation buffer and an output coupled to a first latching node, a second latch including an input coupled to the first latching node and an output coupled to a second latching node, and a control circuit with an input coupled to an initial clock node, a first output coupled to the isolation buffer and a second output coupled to the second latch. The control circuit is configured to cause the clock pulse generator circuit to: (1) drive a leading clock edge of a generated clock pulse at the second latching node by driving the second latching node to a first logic value based on a leading clock edge of an initial clock at the initial clock node and a logic value of an input signal at the signal input node; (2) use the isolation buffer to isolate the first latching node from the signal input node in response to the leading clock edge of the initial clock; (3) maintain the second latch node at the first logic value based upon the generated clock pulse after the leading clock edge of the generated clock pulse has been driven; and (4) drive a trailing clock edge of the generated clock pulse at the second latching node by resetting the second latching node to a second logic value after a first time period.

According to yet another embodiment, a clock pulse generator circuit includes an enable terminal, a clock input terminal, a first latch, an isolation block coupled between the enable terminal and the first latch, a second latch coupled to a clock output terminal, a first buffer coupled between the first latch and the second latch, and a control circuit coupled to the clock input terminal and the clock output terminal. The isolation block is configured to isolate the first latch from the enable terminal based on a first control signal. The first buffer is configured to latch a value from the first latch on the second latch based on a second control signal. The control circuit is configured to generate the first control signal and the second control signal based on the clock input terminal and the clock output terminal.

According to still another embodiment, a memory system includes a memory array, a decoder coupled to the memory array, an address latch coupled to the decoder, an input/output (I/O) circuit configured to receive input data for the memory array and provide output data from the memory array, and a clock pulse generator including a clock input, an enable input, and a clock output coupled to the decoder, the address latch, and the I/O circuit. The clock pulse generator is configured to (1) receive a first edge at the clock input and an enable signal at the enable input; (2) generate an edge at the clock output based on the first edge at the clock input and the enable signal at the enable input; (3) generate an opposite edge at the clock output based on a reset signal; and (4) maintain a logic value on the clock output after generating the opposite edge until a second edge is received at the clock input. The logic value is maintained regardless of slew on the clock input and the second edge matches the first edge.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Description is made with respect to various embodiments in a specific context, namely pulse generators, and in particular embodiments, clock pulse generators. Some of the various embodiments described herein include pulse generators and clock pulse generators for memory systems, computing systems, or pulsed latches. In other embodiments, aspects may also be applied to other applications involving any type of pulse generator according to any fashion as known in the art.

According to various embodiments disclosed herein, a pulse generator is presented with reduced or, in some embodiments, eliminated timing marginalities. The pulse generator operates to latch control signals and to rapidly capture an edge input such that hold time is substantially reduced. Further, the pulse generator operates to isolate control signals from internal latching in certain circumstances in order to provide a highly slew tolerant operation of the pulse generator.

Figure 1:
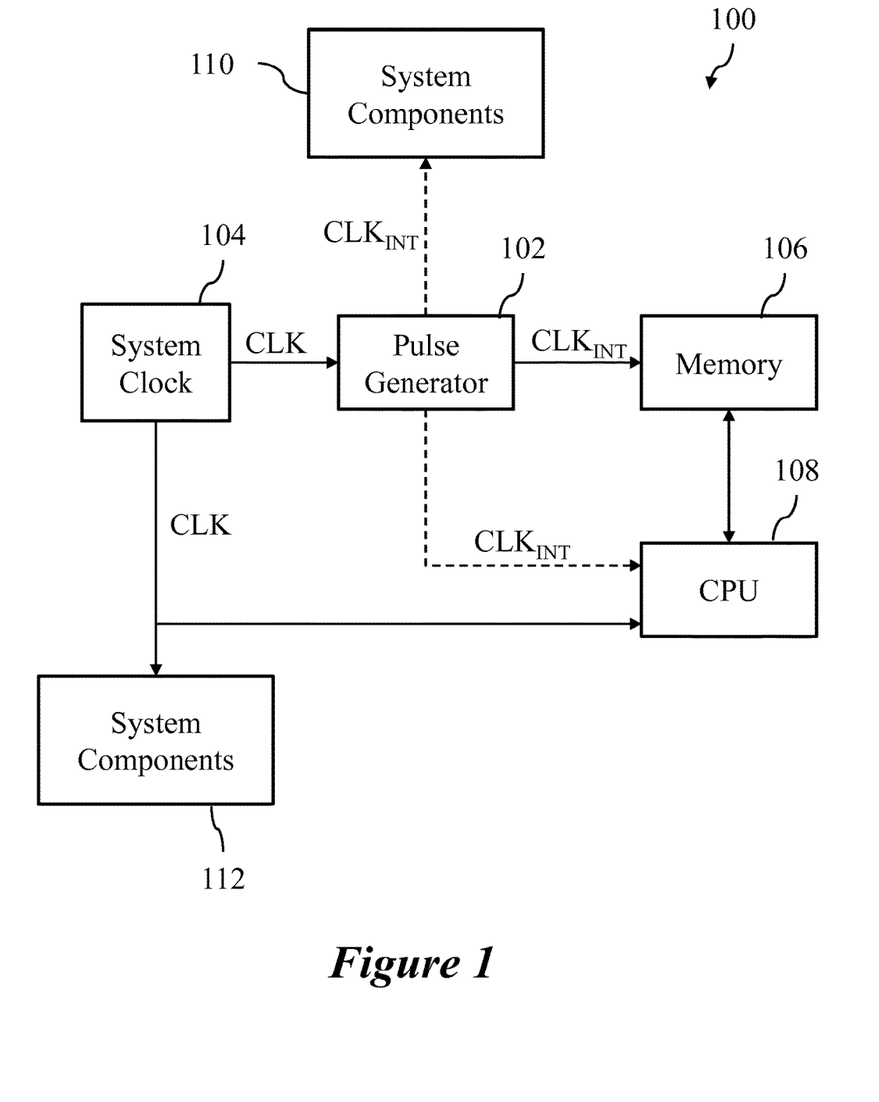
FIG. 1 illustrates a system block diagram including an embodiment pulse generator.

FIG. 1 illustrates a system block diagram including an embodiment pulse generator 102 in computing system 100. According to various embodiments, computing system 100 includes pulse generator 102, system clock 104, memory 106, central processing unit (CPU) 108, and system components 110 and 112. System clock 104 may originate from an oscillator chip or clock generator circuit that is configured to supply system 100 with a synchronous periodic system clock signal CLK. In some embodiments, system clock 104 originates off chip, such as at an external oscillator chip, for example. In other embodiments, system clock 104 is on a same chip or chip stack as memory 106, for example. System components 112 may receive the system clock signal from system clock 104 and contain synchronous digital logic that performs some various functions. System components 112 may include a microcontroller or digital application specific integrated circuits (ASICs) configured to perform specific functions such as I/O interfacing, specific processing tasks, or encryption, for example. Generally, system clock signal CLK is also provided to CPU 108.

Pulse generator 102 is also coupled to system clock 104 and generates an internal clock signal $CLK_{INT}$, which is provided to memory 106. In various embodiments, internal clock signal $CLK_{INT}$ is generated in response to system clock signal CLK, but may have a different high logic to low logic duty cycle. Memory 106 may use the internal clock signal $CLK_{INT}$ to perform memory operations independent of a falling edge on system clock signal CLK, but synchronous with a rising edge on system clock signal CLK, for example. According to some embodiments, internal clock signal $CLK_{INT}$ may also be supplied to system components 110 and CPU 108. For example, system components 110 may include similar components as system components 112 with the exception that the components in system components 110 are configured to operate on internal clock signal $CLK_{INT}$ instead of the system clock signal CLK. Further, CPU 108 may also operate based on internal clock signal $CLK_{INT}$.

Figure 2:
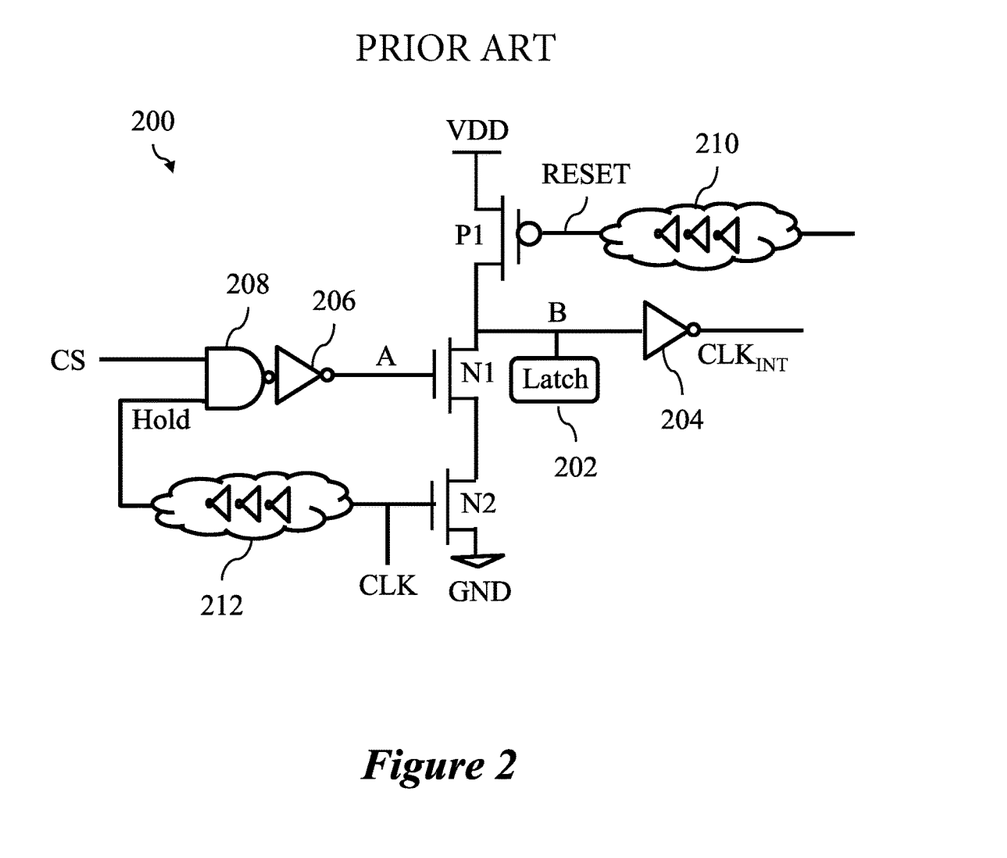
FIG. 2 illustrates a circuit diagram of a conventional clock pulse generator.

FIG. 2 illustrates a circuit diagram of a conventional clock pulse generator 200 including transistors P1, N1, and N2, latch 202, self-time reset 210, and delay chain 212. The conventional clock pulse generator 200 receives a chip select signal CS at NAND gate 208. NAND gate 208 also receives a hold signal from delay chain 212 and outputs, through inverter 206, a drive signal for NMOS transistor N1 on node A. The clock pulse generator 200 also receives a system clock signal CLK at a control terminal of NMOS transistor N2, which has a conduction path coupled to ground (GND) or a low supply voltage (VCC) and to the conduction path of NMOS transistor N1. According to this circuit, delay chain 212 includes an odd number of inverters. When both NMOS transistors N1 and N2 are driven to a conduction state, latch 202 is driven to a low logic state, which is inverted at inverter 204 to supply a rising edge and high logic signal at the output supplying internal clock signal $CLK_{INT}$. Self-time reset 210 provides a driving signal (logic low) for PMOS transistor P1. When PMOS transistor P1 is driven to a conduction state, latch 202 is driven to a high logic state, which supplies a falling edge and a low logic signal on the output supplying internal clock signal CLK. The operation of clock pulse generator 200 is described in reference to the timing diagrams depicted in FIG. 3a.

Figure 3A:
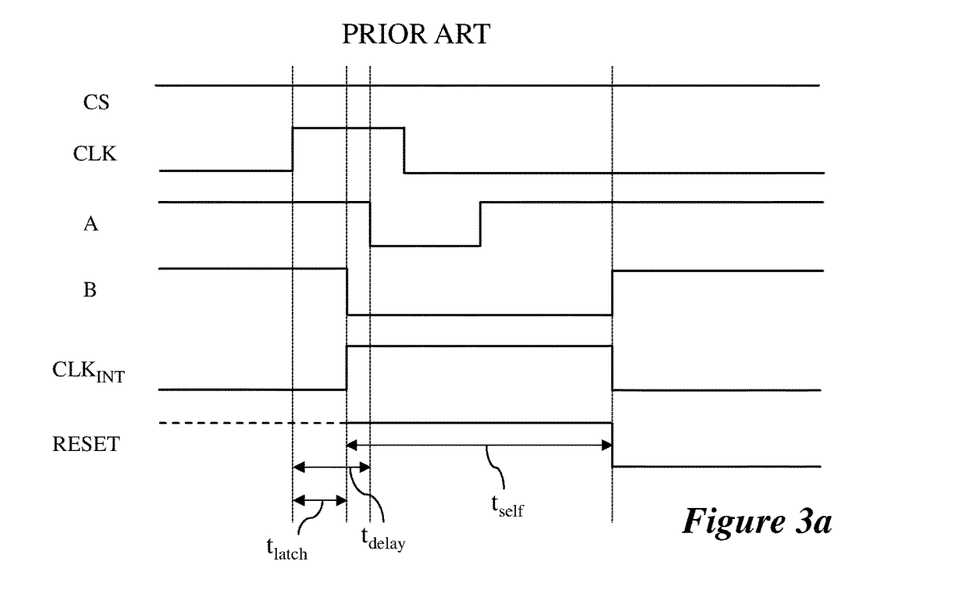
FIGS. 3a and 3b illustrate timing diagrams of the clock pulse generator of FIG. 2.

FIG. 3a illustrates a timing diagram of the clock pulse generator 200 depicted in FIG. 2. FIG. 3a illustrates receiving a rising edge from system clock signal CLK. As shown, chip select signal CS is selected for the entire duration. Nodes A and B are shown at a high logic state initially, which corresponds to the inputs of CS and CLK driving node A to a high logic state and node B having received a reset signal (i.e., latch 202 is in the reset state: logic high). At a first instant, system clock signal CLK has a rising edge. While system clock signal CLK is at a high logic state, NMOS transistor N2 is driven to a conducting state and NMOS transistor N1 was already at a conducting state. Thus, latch 202 and node B are driven to a low logic state at a second instant after a latch delay $t_{latch}$. Shown simultaneous to the falling edge at node B is the rising edge of internal clock signal $CLK_{INT}$. Latch delay $t_{latch}$ is the time between a rising edge on system clock signal CLK and rising edge on internal clock signal $CLK_{INT}$ (or the time to latch the value at node B on latch 202).

Following the rising edge of system clock signal CLK node A is driven to a low logic state after a hold time $t_{delay}$ corresponding to delay chain 212 in FIG. 2. Delay chain 212 and the corresponding hold time $t_{delay}$ are configured to drive node A to a new logic state after node B has been driven to a new logic state and captured in latch 202. In other words, hold time $t_{delay}$ is configured to be longer than latch delay $t_{latch}$, as shown. If, however, node A is driven low before node B is driven low and latched, node B and latch 202 may be prevented from attaining a correct value and internal clock signal $CLK_{INT}$ does not exhibit a rising edge following system clock signal CLK. For this reason, hold time $t_{delay}$ is configured to prevent missed rising edges on system clock signal CLK by including a duration longer than latch delay $t_{latch}$. Further, if chip select signal CS is altered during latch delay $t_{latch}$, latch 202 and node B may also by improperly driven. Thus, chip select signal CS also must be maintained during hold time $t_{delay}$.

After a certain time set by a system clock circuit, the system clock signal CLK also has a falling edge. Self-time reset 210 shown in FIG. 2 generates a self-time delay $t_{self}$ beginning from the rising edge of internal clock signal $CLK_{INT}$. After the self-time delay $t_{self}$, self-time reset drives PMOS transistor P1 to a conducting state with reset signal RESET and resets the logic state on node B and latch 202 to a high logic state, effectively resetting the system.

Figure 3B:
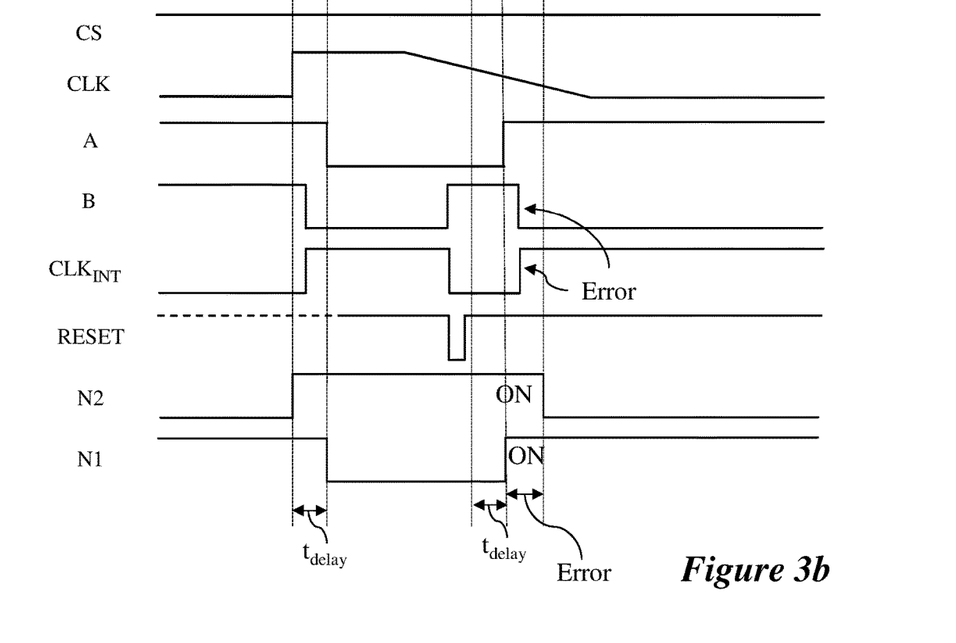

The inventors have discovered that the circuit of FIG. 2 does not always operate as intended. As an example, FIG. 3b illustrates receiving a falling edge from system clock signal CLK with a large slew. As described in reference to FIG. 3a, the signals undergo proper transitions based on a rising edge on system clock signal CLK. In FIG. 3b, the first portion depicting the rising edge transitions is compressed compared to FIG. 3a and only hold time $t_{delay}$ is shown. The falling edge of system clock signal CLK is depicted with a large slew. In this situation, it is possible to incorrectly generate a rising edge on internal clock signal $CLK_{INT}$ if hold time $t_{delay}$ is short in comparison to the large slew of system clock signal CLK and the large slew extends past the reset signal. As shown, reset signal RESET occurs before falling edge of system clock signal CLK, driving node B and latch 202 to a high logic state. As system clock signal CLK is falling, a first threshold is reached triggering delay chain 212 and hold time $t_{delay}$. After hold time $t_{delay}$, node A is driven high, as described above. If node A is driven high while system clock signal CLK is still slewing, it is possible that both NMOS transistors N1 and N2 are driven into a conducting state simultaneously, as shown, creating an error condition. In this case, node B and latch 202 are driven back to a low logic state after having been reset to a high logic state when reset signal RESET was in a low logic state. Thus, an incorrect rising edge on internal clock signal $CLK_{INT}$ is generated as indicated in the Error window.

As shown in FIGS. 3a and 3b, if hold time $t_{delay}$ is not long enough in comparison to the latch delay $t_{latch}$ or the slew of system clock signal CLK, error conditions may arise. Thus, delay chain 212 is configured with a long enough hold time $t_{delay}$ to prevent these problems. This custom configuration of delay chain 212 may be required for different slew rates in system clock signal CLK as well as for different propagation delays in the various components. Further, delay chain 212 usually is configured for a "worst case" clock slew and, in some cases, does not benefit from an improved slew rate (i.e., higher slew rate, less clock slew).

Figure 4:
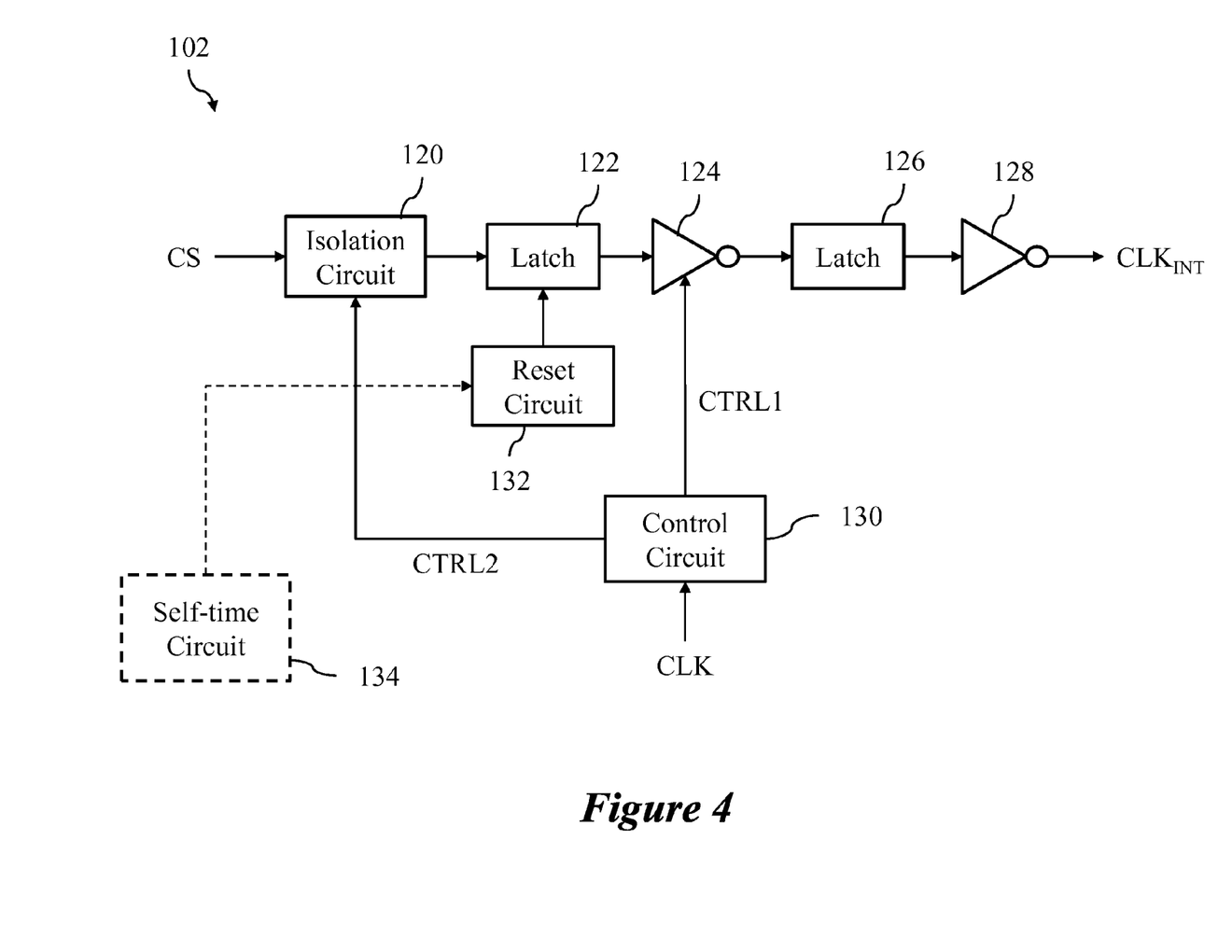
FIG. 4 illustrates a schematic of an embodiment pulse generator.

FIG. 4 illustrates a schematic of embodiment pulse generator 102, as shown in FIG. 1. According to various embodiments, pulse generator 102 includes isolation circuit 120, latch 122, inverter 124, latch 126, inverter 128, control circuit 130, and reset circuit 132. Control circuit 130 receives system clock signal CLK and generates controls signals CTRL1 and CTRL2 for isolation circuit 120 and inverter 124. Isolation circuit 120 is controlled to drive chip select signal CS to latch 122 or to isolate latch 122 from chip select signal CS based on control signal CTRL2 from control circuit 130. Similarly, inverter 124 is controlled to drive the inverse of a logic state stored on latch 122 to latch 126 based on control signal CTRL1. The logic state on latch 126 is inverted at inverter 128 and driven to an output supplying internal clock signal $CLK_{INT}$.

After a self-time delay generated in self-time circuit 134, which is optionally included in pulse generator 102, reset circuit 132 drives latch 122 to a reset logic state and control circuit 130 controls inverter 124 with control signal CTRL1 to drive a reset logic state to latch 126.

In some embodiments, latch 126 may be implemented as a buffered latch that includes a buffer or inverter 124 and latch 126. In such embodiments, inverter 124 and latch 126 may function together as a latching block. In various embodiments, inverter 124 may be implemented as a non-inverting buffer or other circuit block for driving logic states stored on latch 122 to latch 126. Further, inverter 128 may also be eliminated or replaced by a non-inverting circuit block in various embodiments.

Figure 5:
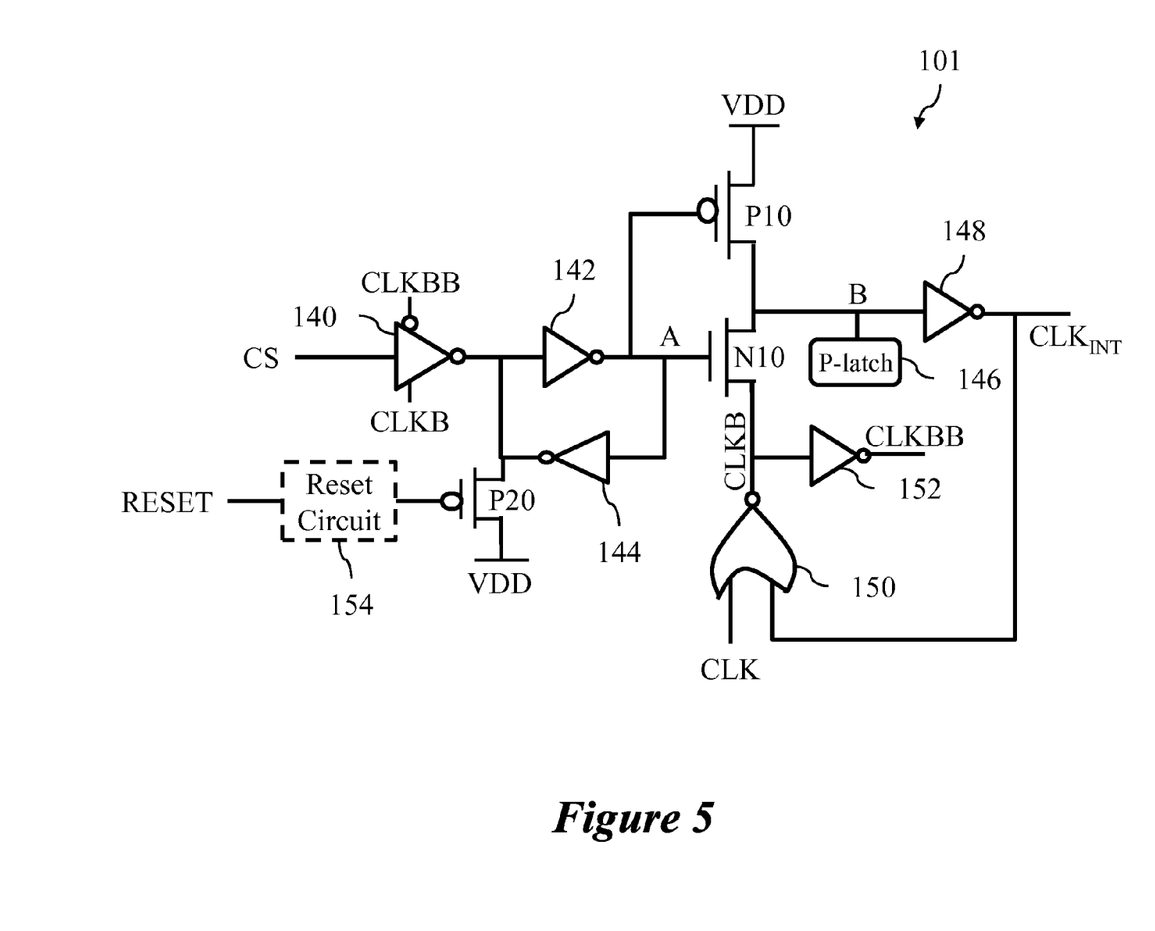
FIG. 5 illustrates a circuit diagram of one embodiment pulse generator.

FIG. 5 illustrates a circuit diagram of one embodiment pulse generator 101 that is a specific implementation of embodiment pulse generator 102. According to various embodiments, pulse generator 101 includes tristate buffer 140, inverters 142 and 144, transistors P10 and N10, P-latch 146, inverter 148, NOR gate 150, inverter 152, transistor P20, and self-time reset circuit 154. Inverters 142 and 144 form a latch at node A, which is a control terminal for PMOS transistor P10 and NMOS transistor N10. When PMOS transistor P10 is driven in a conducting state, node B and P-latch 146 may be driven to a high logic state. When NMOS transistor N10 is driven in a conducting state, node B and P-latch 146 may be driven to the logic state given by control signal CLKB coupled to NOR gate 150. The output supplies an inverted logic signal from P-latch 148 and node B as internal clock signal $CLK_{INT}$. As shown, NOR gate 150 receives internal clock signal $CLK_{INT}$.

In various embodiments, tristate buffer 140 is controlled by control signals CLKB and CLKBB to drive chip select signal CS to inverter 142 or to isolate inverter 142 from chip select signal CS. PMOS transistor P20 may be driven into a conducting state by self-time reset circuit 154 to drive a reset logic state by coupling inverter 142 to supply voltage VDD (e.g., high logic state). In various other embodiments, the inverting and non-inverting characteristics of pulse generator 101 may be readily rearranged or alternately configured to perform similar operations based on falling edges or negative supply voltages. In such embodiments, NMOS and PMOS transistors may be interchanged as is known by those having skill in the art. The specific operation of pulse generator 101 is described below in reference to the timing diagrams illustrated in FIGS. 6a and 6b.

Figure 6A:
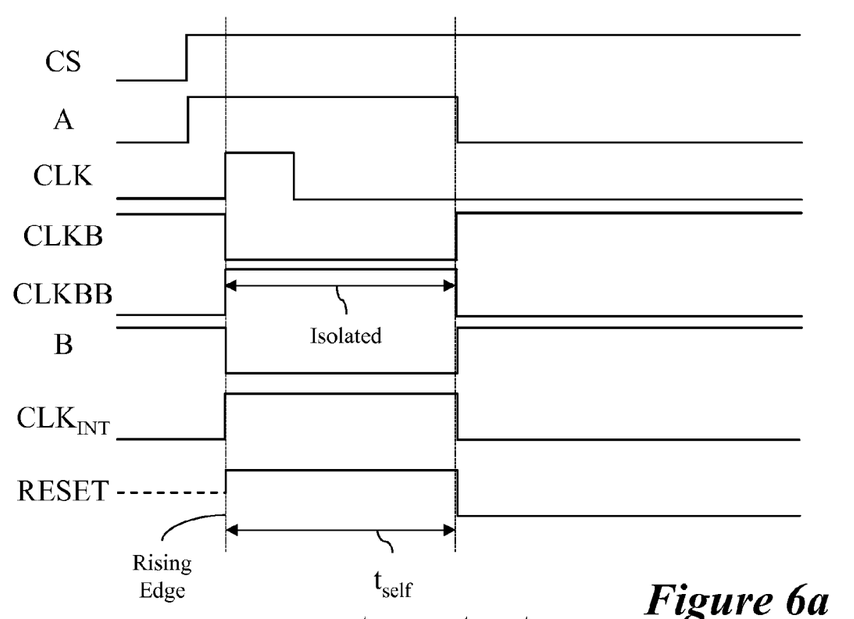
FIGS. 6a and 6b illustrate timing diagrams of the pulse generator of FIG. 5.
Figure 6B:
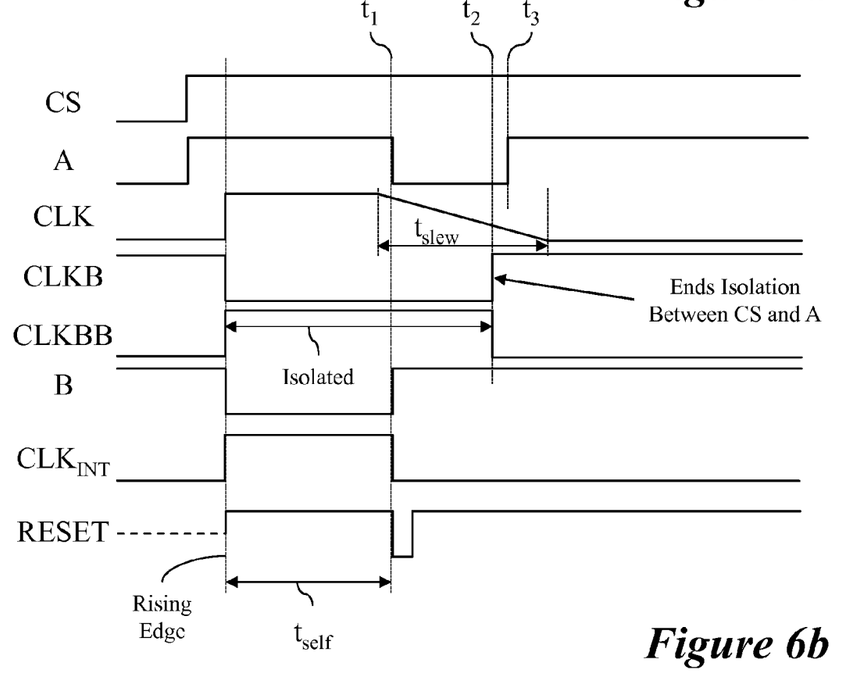

FIGS. 6a and 6b illustrate timing diagrams of the embodiment pulse generator 101 depicted in FIG. 5 and generally apply to various embodiments described herein. FIG. 6a illustrates receiving a rising edge from system clock signal CLK and generating a rising edge on internal clock signal $CLK_{INT}$ in response. According to various embodiments, chip select signal CS is raised to logic high state at a first instant and the logic state on node A follows chip select signal CS to a high logic state. Node A is driven to follow chip select signal CS because tristate buffer 140 is conducting based on control signals CLKB and CLKBB.

In various embodiments, at a second instant, system clock signal CLK undergoes a rising edge transition and control signals CLKB and CLKBB both switch logic states, as shown. During the time while control CLKB is in a low logic state and control signal CLKBB is in a high logic state, node A is isolated from chip select signal CS because tristate buffer 140 is driven to a high impedance state. Thus, the logic state on node A is maintained by inverters 142 and 144 while CLK is in a high logic state and there is no need for a specific hold time as seen in conventional clock pulse generator 200.

Further, in various embodiments, as system clock signal CLK undergoes a rising edge transition, control signal CLKB is driven to a low logic state. Because NMOS transistor N10 is already driven to a conduction state by the high logic state on node A, the low logic state driven by control signal CLKB is supplied to node B and P-latch 146 through conducting NMOS transistor N10. Thus, node B and P-latch 146 are driven low causing an inverted rising edge on the output supplying internal clock signal $CLK_{INT}$. Regardless of a transition on system clock signal CLK, internal clock signal $CLK_{INT}$, node B, and control signals CLKB and CLKBB are maintained in the respective logic states until reset signal RESET causes PMOS transistor P20 to drive a reset signal to node A (e.g., a logic low state) after self-time delay $t_{self}$, as shown. Control signals CLKB and CLKBB are prevented from inverting when system clock signal CLK undergoes a falling edge because NOR gate 150 has a second input coupled to the output providing internal clock signal $CLK_{INT}$. Thus, in various embodiments, tristate buffer 140 is maintained in a high impedance state as long as internal clock signal $CLK_{INT}$ is in a logic high state.

According to various embodiments, reset signal RESET is generated by self-time reset circuit 154, which may include any type of delay blocks configured to generate self-time delay $t_{self}$. In some embodiments, the delay length or self-time delay $t_{self}$ is fixed by a designer. In other embodiments, the delay length may be variable or dependent on the completion of processing steps. In one embodiment where pulse generator 101 is used in a memory system, the delay length or self-time delay $t_{self}$ is configured to extend until a memory operation is completed. For example, self-time delay $t_{self}$ may be configured to drive reset signal RESET after a read/write complete flag is provided to self-time reset circuit 154. Once node A is driven to a logic low value, PMOS transistor P10 immediately drives node B and P-latch 146 to a high logic state, thereby resetting the latch and supplying a falling edge on internal clock signal $CLK_{INT}$.

FIG. 6b illustrates receiving a falling edge from system clock signal CLK with large slew while maintaining an error free internal clock signal $CLK_{INT}$ in response. According to various embodiments, the various signals undergo proper transitions in response to a rising edge on system clock signal $CLK_{INT}$ as described above in reference to FIG. 6a. After self-time delay $t_{self}$ is completed, reset signal RESET drives PMOS transistor P20 into a conducting state, which drives node A to a logic low state.

In various embodiments, reset signal RESET may cause node A to be driven low before system clock signal CLK has a falling edge or while system clock signal CLK is still slewing, as shown by the overlap between self-time delay $t_{self}$ and the slew time $t_{slew}$. In response to reset signal RESET, node A drives PMOS transistor P10 to reset node B and P-latch 146 to a logic high state and then reset signal RESET is turned off (e.g., logic high state). In such embodiments, at time t1, reset signal RESET cause node A to be driven low, node B to be driven high, and internal clock signal $CLK_{INT}$ to be driven low (i.e., undergo a falling edge transition).

After reset signal is turned off, control signals CLKB and CLKBB do not transition until time t2, which is when system clock signal falls below 20% of a high logic state, for example. At time t2, control signals CLKB and CLKBB transition, enabling tristate buffer 140 to drive node A to a high logic state according to chip select signal CS at time t3. Thus, in various embodiments, control signals CLKB and CLKBB prevent node A to be driven high while system clock signal CLK is still slewing. If, however, node A is driven high while system clock signal is still slewing, control signal CLKB may drive a low logic state to node B and P-latch 146 because NMOS transistor N10 may be conducting due to node A being at a high logic state. However, the various embodiments described herein illustrate that control signals CLKB and CLKBB are arranged such that tristate buffer 140 isolates node A until after control signal CLKB is at a high logic state, thus preventing node B and P-latch 146 from being driven back to a low logic state and supplying an erroneous rising edge on internal clock signal $CLK_{INT}$ after having been reset by reset signal RESET.

It should be noted in reference to FIGS. 3a, 3b, 6a, and 6b that the time scale is not drawn according to a continuous or proportional manner. Some delays are illustrated as longer or shorter in order to convey the concepts related to embodiments described herein. Similarly, some delays are ignored in order to simplify the description. Generally, single gate delays, or a few gate delays are illustrated as instantaneous for simplification. A person having ordinary skill in the art will recognize that such gates still produce some delay which may be significant in various embodiments. Embodiments described herein are fully envisioned in systems with large or small gate delays and significant slew rates in both system clock signal CLK, or equivalent, as well as other system signals.

Further, in the various embodiments described herein, it should be understood that logic states along with inverting and non-inverting blocks may be freely rearranged to perform substantially the same function or the same function in inverse. Such embodiments are within the scope of this disclosure.

Figure 7:
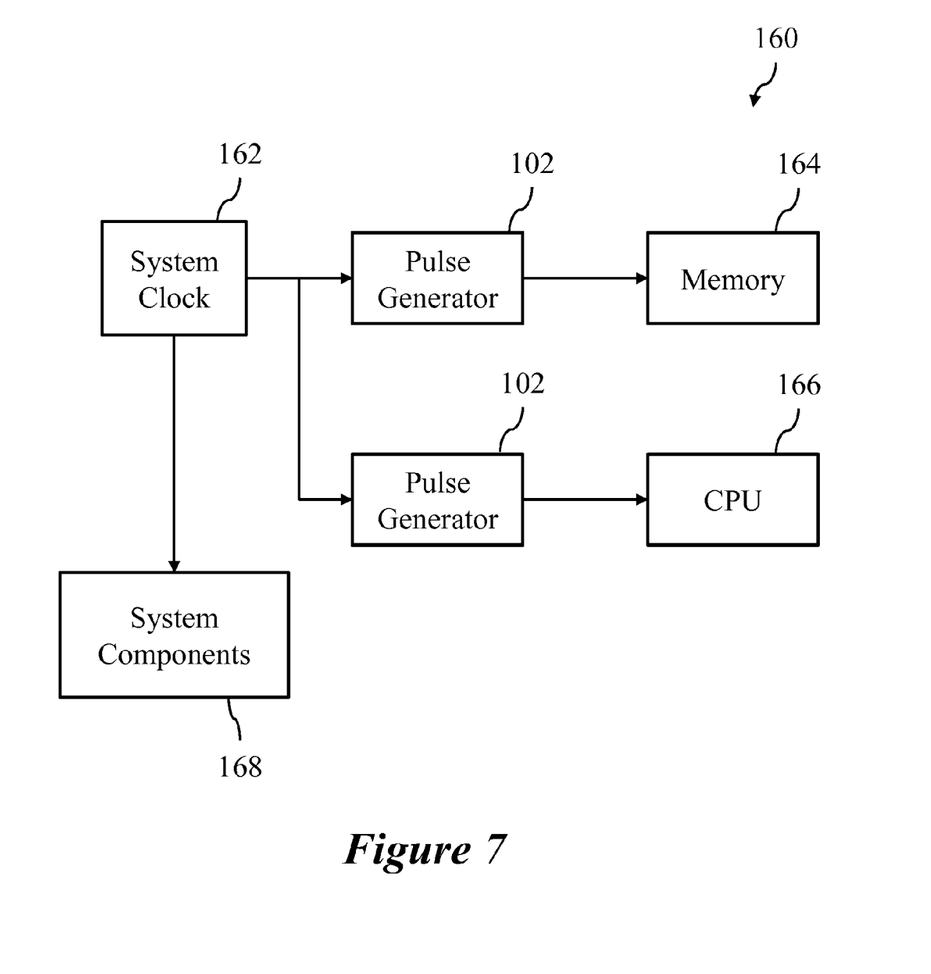
FIG. 7 illustrates a system block diagram including multiple embodiment pulse generators.

FIG. 7 illustrates a system block diagram of computing system 160 including multiple embodiment pulse generators 102. According to various embodiments, computing system 160 includes two pulse generators 102, system clock circuit 162, memory 164, CPU 166, and system components 168. Description of computing system 100 above in reference to FIG. 1 applies to computing system 160 with the exception that multiple pulse generators 102 may be included for each component, such as memory 164 and CPU 166 as shown. Additional components may be included with additional pulse generators 102. In some embodiments, a pulse generator 102 may be included in a specific component and does not necessarily need to stand alone as shown. For example, pulse generators may be included in CPU 166 or memory 164.

Figure 8:
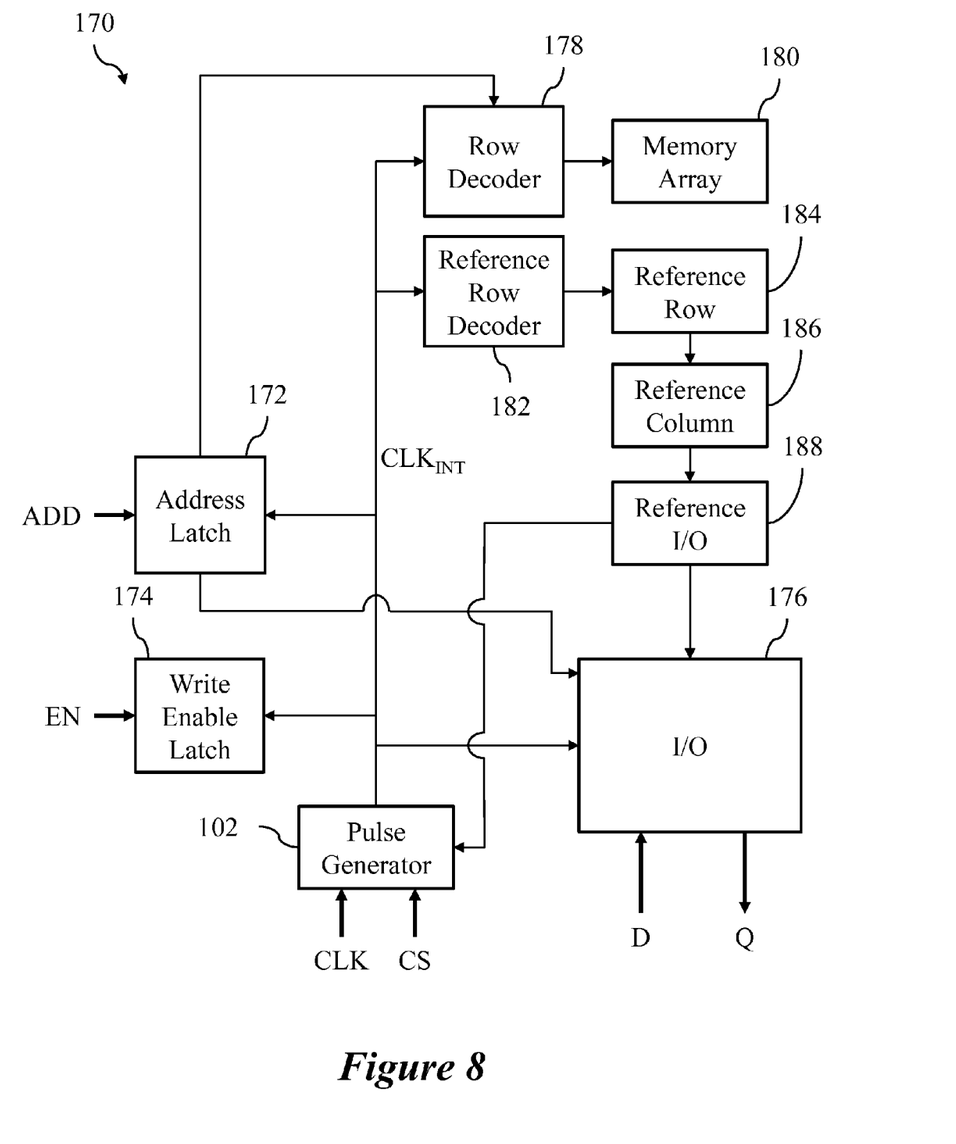
FIG. 8 illustrates a system block diagram of a memory including an embodiment pulse generator.

Along these lines, FIG. 8 illustrates a system block diagram of a memory 170 including an embodiment pulse generator 102. According to various embodiments, memory 170 includes pulse generator 102, address latch 172, write enable latch 174, input/output (I/O) block 176, row decoder 178, memory array 180, reference row decoder 182, reference row 184, reference column 186, and reference I/O 188. In such embodiments, the memory components operate according to principles known in the art, but are configured to receive synchronous periodic clock signals from pulse generator 102.

In such embodiments, pulse generator 102 provides the internal clock signal $CLK_{INT}$ based on system clock signal CLK and chip select signal CS. Internal clock signal $CLK_{INT}$ is provided to write enable latch 174, address latch 172, row and reference row decoders 178 and 182, and I/O block 176. According to various embodiments, I/O block 176 is coupled to memory array 180 and may include amplifiers, multiplexers, decoders, or other circuit components for reading and writing to and from memory. Further, reference I/O 188 may also contain a self-time circuit for generating a reset signal as described in reference to the other figures. According to various embodiments, embodiment pulse generators may be included in any memory system.

Figure 9:
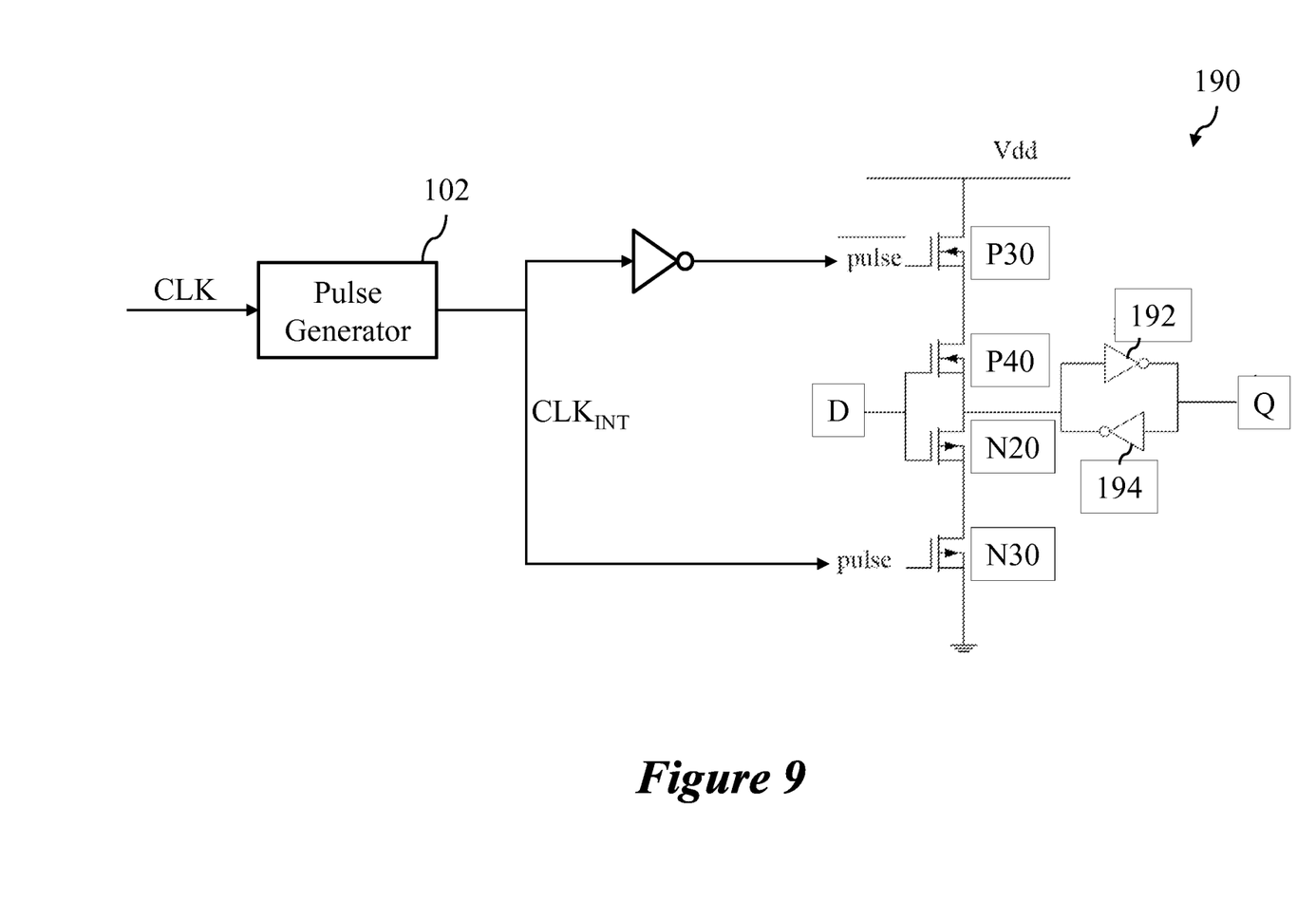
FIG. 9 illustrates a schematic of a pulsed D-latch including an embodiment pulse generator.

FIG. 9 illustrates a schematic of a pulsed D-latch 190 including an embodiment pulse generator 102. According to various embodiments, pulse generator 102 supplies an inverted and a non-inverted version of internal clock signal $CLK_{INT}$ to PMOS transistor P30 and NMOS transistor N30, respectively. Thus, a rising edge on system clock signal CLK, and consequently on internal clock signal $CLK_{INT}$, will cause PMOS transistor P30 and NMOS transistor N30 to supply PMOS transistor P40 and NMOS transistor N20 and enable input D to be driven onto the latch formed by inverters 192 and 194. Inverters 192 and 194 maintain and supply output Q. In such embodiments, pulse generator 102 and D-latch 190 are operated together as a D-type flip-flop.

In the figures described herein, the transistors are generally presented as a single type, i.e., MOS transistors (NMOS and PMOS). However, any type of transistor or basic circuit components may be used in other embodiments. In some embodiments, FinFETs may be used in place of the transistors described herein, for example.

Figure 10:
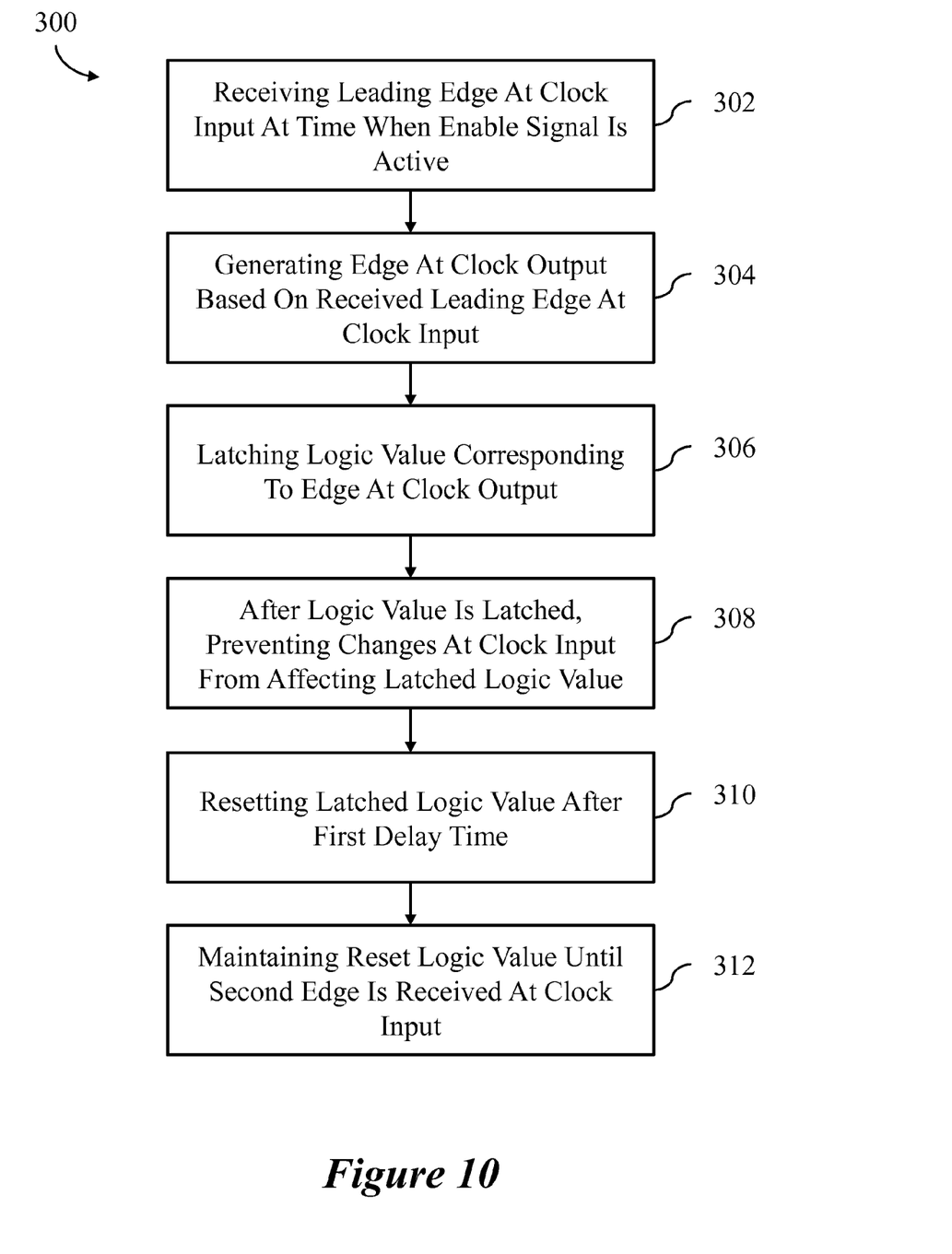
FIG. 10 illustrates a block diagram of a method of operation.

FIG. 10 illustrates a block diagram of a method of operation 300 for generating a clock pulse including steps 302-312. According to various embodiments, step 302 includes receiving a leading edge at a clock input at a time when an enable signal is active. In such embodiments, the leading edge may be a rising edge, such as a rising edge on a system clock, for example. In other embodiments, the logic may be swapped and the leading edge may include a falling edge.

Step 304 includes generating an edge at a clock output based on the received leading edge at the clock input. Further, step 306 includes latching a logic value corresponding to the edge at the clock output. The enable signal may be latched in a first latch and the logic value corresponding to the edge at the clock output may be latched in a second latch. In some embodiments, the first latch may drive an inverter to supply the second latch.

Step 308 includes, after the logic value is latched, preventing changes at the clock input from affecting the latched logic value. In some embodiments, preventing changes at the clock input from affecting the latched logic value may include a control circuit coupled to the clock output that maintains the latched logic value until another signal overrides the control circuit. Resetting the latched logic value after a first delay time is included in step 310. In some embodiments, resetting overrides the control circuit and drives the latched logic value in the second latch back to a reset logic value.

Step 312 includes maintaining the reset logic value until a second edge is received at the clock input. In various embodiments, the clock input may still be slewing from a first logic value associated with the leading edge. For example, when the leading edge is a rising edge, the clock input may include a falling edge, and in some embodiments, the falling edge may have a large slew (i.e., a small slew rate). Thus, it may be possible that the latched logic value is reset in step 310 before the clock input has reached a low logic value, for example. In such a case, the reset logic value is maintained until the clock input finishes slewing (e.g., goes below a threshold voltage) and may be further maintained until another edge is received. In various embodiments, the second edge at the clock input matches the leading edge at the clock input. For example, if the leading edge is a rising edge, the reset logic value is maintained after reset until another rising edge is received. In some embodiments, the enable signal must also be set to enable before the reset logic value is driven to another logic value.

According to various embodiments described herein, advantages may include may include a pulse generator that is substantially free of timing marginalities that cause error conditions. According to some embodiments, advantages include pulse generators that are insensitive or minimally sensitive to input slew. Further embodiment pulse generators advantageously include reduced hold time of input signals. In some cases the hold time is on the order of transistor switching times and single gate delays.

The logic values described herein may be freely interchanged according to any embodiments. For example, clock inputs described in reference to rising edges may be switched to operate in reference to falling edges. Inverters may be replaced with buffers and vice versa in different embodiments and all the timing diagrams may be partially or fully inverted to describe such inverted embodiments. One skilled in the art will readily appreciate modifications and alternative logic configurations with behavior substantially matching embodiments described herein. Such alternative configurations are fully envisioned within the scope of embodiments.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of generating a clock pulse, the method comprising:
   receiving an enable signal at an input of a tri-state buffer;
   receiving a leading edge of an input clock at a clock input at a time when an enable signal is active, the clock input coupled to a first input of a logic gate;
   generating a leading edge of an output clock at a clock output based on the received leading edge of the input clock;
   latching a logic value corresponding to the leading edge of the output clock at the clock output;

after the logic value is latched, feeding a value representative of the output clock back to second input of the logic gate to prevent changes at the clock input from affecting the latched logic value and feeding the value representative of the output clock back to a control input of the tri-state buffer to isolate the latched logic value from changes of the enable signal at the input of the tri-state buffer;

resetting the latched logic value after a first delay time thereby causing a trailing edge at the clock output; and maintaining the reset logic value until a second leading edge is received at the clock input.

2. The method of claim 1, further comprising:

receiving a trailing edge at the clock input, the trailing edge having a large slew and occurring between the leading edge and the second leading edge at the clock input; and generating a further edge at the clock output based on the resetting the latched logic value, wherein the resetting the latched logic value occurs during the slew of the trailing edge at the clock input when a logic level at the clock input is above a threshold to latch the logic value.

3. The method of claim 1, wherein the leading edge and the second leading edge comprise rising edges.

4. The method of claim 1, further comprising isolating the latched logic value after the logic value is latched until a trailing edge of the input clock is received at the clock input, the trailing edge being opposite compared to the leading edge and occurring before the second leading edge.

5. The method of claim 4, wherein isolating the logic value comprises disabling a tristate buffer coupled to receive the enable signal, the disabling based on the clock output.

6. A method of generating a clock pulse, the method comprising:

receiving a leading edge of an input clock at a clock input at a time when an enable signal is active;

generating a leading edge of an output clock at a clock output based on the received leading edge of the input clock;

latching a logic value corresponding to the leading edge of the output clock;

after the logic value is latched, isolating the latched logic value from changes at the enable signal and at the clock input, wherein isolating the latched logic value is based on the clock output; and generating a trailing edge of the output clock at the clock output by resetting the latched logic value after a first delay time relative to the leading edge of the output clock.

7. The method of claim 6, further comprising maintaining the reset logic value until a second leading edge of the input clock is received at the clock input.

8. The method of claim 7, further comprising maintaining the isolating until a third edge at the clock input, after the resetting, wherein the third edge occurs between the leading edge and the second edge.

9. The method of claim 6, wherein the enable signal is provided at an input of a tri-state buffer and wherein isolating the latched logic value from changes at the enable signal comprises feeding a value representative of the output clock back to the tri-state buffer.

10. A clock pulse generator circuit, the circuit comprising:

an isolation buffer comprising an input coupled to a signal input node and a control input;

a first latch comprising an input coupled to an output of the isolation buffer and an output coupled to a first latching node;

a second latch comprising an input coupled to the first latching node and an output coupled to a second latching node; and a control circuit with an input coupled to an initial clock node, a first output coupled to the control input of the isolation buffer and a second output coupled to the second latch, wherein the control circuit is configured to cause the clock pulse generator circuit to:

drive a leading clock edge of a generated clock pulse at the second latching node by driving the second latching node to a first logic value based on a leading clock edge of an initial clock at the initial clock node and a logic value of an input signal at the signal input node, control the control input of the isolation buffer to use the isolation buffer to isolate the first latching node from the signal input node in response to the leading clock edge of the initial clock, maintain the second latch node at the first logic value based upon the generated clock pulse after the leading clock edge of the generated clock pulse has been driven, and drive a trailing clock edge of the generated clock pulse at the second latching node by resetting the second latching node to a second logic value after a first time period.

11. The clock pulse generator circuit of claim 10, wherein the control circuit is further configured to maintain the isolation buffer isolating the first latching node from the signal input at least until the initial clock experiences a second clock edge.

12. The clock pulse generator circuit of claim 11, wherein the second clock edge comprises a trailing edge of the initial clock, the trailing edge completing a transition after the trailing clock edge of the generated clock.

13. The clock pulse generator circuit of claim 10, wherein the control circuit includes a second input coupled to the second latching node.

14. The clock pulse generator circuit of claim 13, wherein the second latch includes an inverter coupled between the first latching node and the second latching node, wherein the inverter is configured to receive control signals from the control circuit.

15. The clock pulse generator circuit of claim 10, wherein the first time period is independent of a duty cycle of the initial clock.

16. A clock pulse generator circuit, the circuit comprising:

an enable terminal;

a clock input terminal;

a first latch;

an isolation block coupled between the enable terminal and the first latch, wherein the isolation block is configured to isolate the first latch from the enable terminal based on a first control signal;

a second latch coupled to a clock output terminal;

a first buffer coupled between the first latch and the second latch, wherein the first buffer is configured to latch a value from the first latch on the second latch based on a second control signal; and a control circuit coupled to the clock input terminal and the clock output terminal, wherein the control circuit is configured to generate the first control signal and the second control signal based on the clock input terminal and the clock output terminal;

the isolation block comprises a tristate buffer with a logic input coupled to the enable terminal and a control input coupled to the control circuit;

the circuit further comprises a reset circuit;
the first latch comprises an input and an output, wherein the input is coupled to an output of the tristate buffer and to the reset circuit;
the first buffer comprises a first inverter with an input, an output, a first supply terminal, and a second supply terminal, wherein the input is coupled to the output of the first latch, the first supply terminal is coupled to a first reference supply, and the second supply terminal is coupled to the control circuit;
the second latch coupled to the output of the first inverter and configured to supply the clock output terminal; and
the control circuit has a first input coupled to the clock input terminal and a second input coupled to the clock output.

17. The circuit of claim 16, wherein the control circuit comprises a NOR gate with inputs coupled to the clock input terminal and the clock output terminal and an output configured to supply the second control signal.

18. The circuit of claim 17, wherein the first control signal comprises the second control signal and an inverse of the second control signal.

19. The circuit of claim 16, wherein the isolation block comprises a tristate buffer configured to be enabled by the first control signal.

20. The circuit of claim 16, further comprising a reset circuit coupled to the first latch, wherein the reset circuit is configured to reset the latch based on a reset delay.

21. The circuit of claim 20, wherein the reset delay is a fixed value.

22. The clock generator circuit of claim 16, wherein the control circuit comprises:
a NOR logic gate with a first input coupled to the clock input, a second input coupled to the clock output, and an output coupled to the second supply terminal; and
a second inverter with an input coupled to the output of the NOR logic gate and an output coupled to the control input of the tristate buffer.

23. The clock generator of claim 22, wherein the control input of the tristate buffer comprises a first control input coupled the output of the second inverter and a second control input coupled to the output of the NOR logic gate.

24. The clock generator circuit of claim 16, wherein the first inverter comprises a P-type MOS transistor and an N-type MOS transistor, wherein:
a control terminal of the P-type MOS transistor and a control terminal of the N-type MOS transistor are coupled to the output of the first latch;
a first conduction terminal of the P-type MOS transistor is coupled to the first supply terminal;
a second conduction terminal of the P-type MOS transistor is coupled to a middle terminal, the middle terminal coupled to the second latch;
a first conduction terminal of the N-type MOS transistor is coupled to the middle terminal; and
a second conduction terminal of the N-type MOS transistor is coupled to the second supply terminal.

25. A memory system comprising:
a memory array;
a decoder coupled to the memory array;
an address latch coupled to the decoder;
an input/output (I/O) circuit configured to receive input data for the memory array and provide output data from the memory array; and
a clock pulse generator comprising a clock input, an enable input, and a clock output coupled to the decoder, the address latch, and the I/O circuit, wherein the clock pulse generator is configured to:
receive a first edge at the clock input and an enable signal at the enable input;
generate an edge at the clock output based on the first edge at the clock input and the enable signal at the enable input;
generate an opposite edge at the clock output based on a reset signal; and
maintain a logic value on the clock output after generating the opposite edge until a second edge is received at the clock input, wherein the logic value is maintained regardless of slew on the clock input and the second edge matches the first edge.

26. The memory system of claim 25, further comprising generating a further edge at the clock output based on the second edge at the clock input and the enable signal at the enable input.

27. The memory system of claim 25, wherein generating the opposite edge at the clock output based on the reset signal is dependent on the reset signal and independent of edges at the clock input.

28. The memory system of claim 25, wherein the memory system comprises a system on a chip (SOC) and wherein the clock input is coupled to a system clock for the SOC.

29. The memory system of claim 25, wherein the clock input is coupled to an external oscillator chip.

30. The memory system of claim 25, further comprising a write enable coupled to the clock pulse generator.

31. The memory system of claim 25, further comprising:
a reference decoder coupled to the clock pulse generator; and
a reference I/O circuit coupled to the I/O circuit, the reference decoder, and the clock pulse generator.

32. The memory system of claim 31, wherein the reference I/O circuit is configured to provide the reset signal to the clock pulse generator after the memory system completes a memory operation on the memory array.

33. The memory system of claim 25, further comprising a fixed delay circuit configured to generate the reset signal.

* * * * *